United States Patent
Yin et al.

(10) Patent No.: US 6,900,138 B1
(45) Date of Patent: May 31, 2005

(54) OXYGEN PLASMA TREATMENT FOR NITRIDE SURFACE TO REDUCE PHOTO FOOTING

(75) Inventors: Zhiping Yin, Boise, ID (US); Mark Fischer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/259,762

(22) Filed: Mar. 1, 1999

(51) Int. Cl.[7] ........................................... H01L 21/302
(52) U.S. Cl. ................... 438/725; 438/710; 438/724; 438/726; 430/271.1; 430/327; 427/532; 427/535; 427/539; 427/575
(58) Field of Search ............................. 438/709, 710, 438/724, 725, 728, 729, 732, 703, 763, 700, 706; 257/649, 341, 331, 401; 427/532, 535, 539, 569, 575; 430/312, 313, 327, 271.1

(56) References Cited

U.S. PATENT DOCUMENTS

| | | | |
|---|---|---|---|
| 4,330,569 A | * 5/1982 | Gulett et al. | 427/539 |
| 4,673,456 A | * 6/1987 | Spencer et al. | 156/345 |
| 4,699,689 A | * 10/1987 | Bersin | 438/709 |
| 5,212,119 A | * 5/1993 | Hah et al. | 438/763 |
| 5,304,453 A | 4/1994 | Lin | 430/252 |
| 5,366,852 A | 11/1994 | Pavelchek et al. | 430/326 |
| 5,372,677 A | 12/1994 | Katayama et al. | 156/659.1 |
| 5,429,673 A | 7/1995 | Peterson et al. | 106/287.11 |
| 5,486,267 A | 1/1996 | Knight et al. | 156/659.11 |
| 5,576,147 A | 11/1996 | Guckel et al. | 430/313 |
| 5,647,953 A | 7/1997 | Williams et al. | 156/643.1 |
| 5,656,548 A | 8/1997 | Zavracky et al. | 438/23 |
| 5,674,357 A | * 10/1997 | Sun et al. | 156/659.11 |
| 5,705,318 A | 1/1998 | Mehregany et al. | 430/312 |
| 5,714,037 A | 2/1998 | Puntambekar et al. | 156/643.1 |
| 5,745,336 A | 4/1998 | Saito et al. | 361/321.5 |
| 5,755,947 A | 5/1998 | McElhanon et al. | 205/118 |
| 5,803,974 A | 9/1998 | Mikoshiba et al. | 118/723 |
| 5,807,660 A | * 9/1998 | Lin et al. | 430/313 |
| 5,821,603 A | * 10/1998 | Puntambekar | 257/640 |
| 6,051,282 A | * 4/2000 | Konjuh et al. | 427/539 |
| 6,143,666 A | * 11/2000 | Lin et al. | 438/725 |
| 6,174,816 B1 | * 1/2001 | Yin et al. | 438/705 |
| 6,291,363 B1 | * 9/2001 | Yin et al. | 438/769 |
| 6,380,611 B1 | * 4/2002 | Yin et al. | 257/649 |
| 6,562,544 B1 | * 5/2003 | Cheung et al. | 430/313 |
| 2002/0140056 A1 | * 10/2002 | Yin et al. | 257/629 |

FOREIGN PATENT DOCUMENTS

JP 60-213025 10/1985 ........... H01L/21/30

OTHER PUBLICATIONS

Wolf et al., "Silicon Processing for the VLSI ERA, vol. 1: Process Technology", Lattice Press, 1986, p. 407–409 and 427–428.*

* cited by examiner

Primary Examiner—Tom Thomas
Assistant Examiner—JoséR. Diaz
(74) Attorney, Agent, or Firm—Schwegman, Lundberg, Woessner & Kluth, P.A.

(57) ABSTRACT

The present invention includes a method for preventing distortion in semiconductor fabrication. The method comprises providing a substrate comprising a film comprising silicon nitride. The substrate is treated in a vacuum of about 3.0–6.5 Torr in an atmosphere comprising oxygen plasma wherein the oxygen plasma flow rate is at least about 300 sccm oxygen. A resist is applied to the treated substrate and the resist is patterned over the treated substrate.

20 Claims, 2 Drawing Sheets

OXYGEN PLASMA TREATMENT FOR NITRIDE SURFACE TO REDUCE PHOTO FOOTING

FIELD OF THE INVENTION

The present invention relates to a method for semiconductor substrate treatment to reduce profile distortion, such as footing and undercutting, during photolithographic fabrication, prior to applying a photoresist to the substrate and relates to the treated substrate.

BACKGROUND OF THE INVENTION

Photolithographic techniques used in the fabrication of semiconductor-based electronic devices rely upon a material that undergoes a chemical change when exposed to activating radiation. The material, known as a "photoresist," is positioned over a semiconductor substrate and forms a mask over the substrate. Semiconductor substrates typically comprise wafers that have been fabricated from materials such as silicon, aluminum, polymeric resins, silicon dioxide, doped silicon dioxide, silicon resins, gallium arsenide, silicon nitride, copper, aluminum-copper mixtures and ceramics.

In semiconductor circuit fabrication, the photoresist mask acts as a template that imparts features of a microcircuit to the substrate. The photoresist mask is applied to the substrate by a method such as dip coating, spray coating, and spin coating. Mask thickness is adjusted in the spin coating method by adjusting solids content of the mask material.

In addition to the photoresist, photolithographic techniques utilize a polymeric composition in conjunction with a developer solvent that selectively removes only exposed portions of the photoresist in one embodiment, which is a positive acting photoresist, and only unexposed portions of the photoresist in another embodiment, which is a negative acting photoresist. This selective removal produces a patterned photoresist layer. The patterned photoresist layer provides a patterned mask for subsequent steps of circuit fabrication such as ion implantation, etching, or patterned deposition of materials by lift-off techniques. The lift-off techniques include depositing a microcircuit material all over the surface of the substrate, applying the patterned photoresist mask, treating the mask with the activating radiation, and then removing portions of the photoresist with the developer solvent in order to transfer the mask pattern to the microcircuit material. The steps of mask material application—mask formation and lift-off—may be repeated in order to vertically fabricate the microcircuit from the semiconductor and other materials.

Because critical dimensions of a semiconductor microcircuit are predetermined by dimensions of openings in the photoresist curing mask, it is essential that each step in the photolithography process transfer an accurately patterned mask for each subsequent step. It is important that critical dimensions are maintained throughout the photolithography process. Achieving the precise transfer requires that any surface overlaid by a photoresist be substantially free of discontinuities.

Maintaining critical dimensions becomes increasingly difficult to achieve as multiple layers are fabricated using the steps of coating a resist on a substrate to make a mask, forming a resist pattern on the mask, etching by using the resist pattern of the mask and stripping the resist to form a portion of a microcircuit. Any imperfection such as a surface discontinuity occurring as a result of fabrication of one of the layers becomes magnified in the fabrication of subsequent layers.

These imperfections such as surface discontinuities are manifested as a profile distortion at an interface between the resist and the substrate. The profile distortion takes the form of "footing" on positive resists and "undercutting" on negative resists. The problems of "footing" and "undercutting" prevent satisfactory control of patterning in the fabrication of critical dimensions using the photolithography technology. Thus, the usefulness of photoresist-based fabrication is significantly hampered, particularly for fabrication of tiny components.

This imperfection problem is particularly aggravated for acid catalyzed photoresists. The Knight et al. patent, U.S. number 5,486,267, which issued Jan. 23, 1996, describes a method for preparing an acid catalyzed substrate prior to applying a photoresist to the substrate. The method treats a substrate comprising chemically vapor deposited films of materials such as silicon dioxide and silicon nitride with a reactive oxygen species such as ozone.

The Katayama, et al. U.S. Pat. No. 5,372,677, which issued Dec. 13, 1994, describes another method for reducing profile distortion occurring as a result of an act of stripping an upper layer side resist. The method includes a step of treating a surface of a resist pattern with a plasma. The plasma is an oxygen plasma.

The Lind patent, U.S. Pat. No. 5,304,453, which issued Apr. 19, 1994, describes a method of forming a pattern on a semiconductor substrate. The method includes exposing a photo image, etch resistant pattern to an oxygen plasma. The pattern is transferred from its initial carrier substrate, the mask, to a receiver substrate by use of a hardenable liquid adhesive. An oxygen plasma is used to etch and to remove substrate material that does not improve adhesion.

The Pavelchek et al., U.S. Pat. No. 5,366,852, which issued Nov. 22, 1994, describes transferring patterns of micron and sub-micron dimensions to a substrate by dry etching. The dry etching method is set to utilize plasma or reactive ion etching to remove specific areas of material on a surface so that a pattern remains on the surface. The patent describes an embodiment where an organic polymer is used as a substrate and dry etching is performed using an oxygen plasma or oxygen reactive ion etchant.

The Putpuntambekar et al. patent, U.S. Pat. No. 5,714,037, which issued Feb. 3, 1998, describes several methods for improving adhesion between various materials used in fabricating integrated circuits. One of the methods includes improving adhesion between a silicon-nitride layer and a polyimide layer by treating the silicon-nitride with oxygen plasma.

A Japanese patent application number 59-070464, filed Apr. 9, 1984, to Sanyo Electric Company describes treating a chrome film with an oxygen plasma to roughen the surface of the chrome film. The roughened surface is overlaid with a hexamethyl disilazane.

SUMMARY OF THE INVENTION

Figure 1:
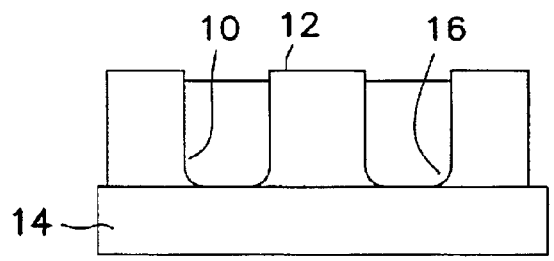
FIG. 1 is a prior art cross-sectional view of a trench patterned in a photo resist showing "footing".

One embodiment of the present invention comprises a method for reducing profile distortion in semiconductor fabrication. The method includes providing a substrate comprising a film comprising silicon nitride. The substrate is treated in a vacuum of about 3.0 to 6.5 Torr in an atmosphere comprising oxygen plasma and an inert gas. The oxygen plasma flow rate comprises about 300 sccm to about 2000 sccm oxygen and about 400 to 1000 sccm helium. A resist is applied to the treated substrate and the substrate is patterned with a reduced profile distortion such as footing or undercutting.

Another embodiment of the present invention comprises a patterned silicon nitride film treated with an oxygen plasma. The patterned silicon nitride film is resistant to photolithography profile distortions such as footing or undercutting.

One other embodiment of the present invention includes a semiconductor that comprises a substrate, a silicon nitride film that overlays the substrate and a microcircuit positioned within and on the silicon nitride film. The microcircuit is substantially free from profile distortion.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the invention.

For purposes of this specification, the terms "chip", "wafer" and "substrate" include any structure having an exposed surface of semiconductor material with which to form integrated circuit (IC) structures. These terms are also used to refer to semiconductor structures during processing and may include other layers that have been fabricated thereupon. The terms include doped and undoped semiconductors, epitaxial semiconductor layers supported by a base semiconductor or insulator, as well as other semiconductor structures well known in the art. The term "conductor" is understood to include semiconductors, and the term "insulator" is defined to include any material that is less electrically conductive than the materials referred to as "conductors." The following detailed description is, therefore, not to be taken in a limiting sense.

One embodiment of a method of the present invention for reducing profile distortion in a semiconductor substrate overlaid with a photoresist, comprises providing a semiconductor substrate made of a material such as silicon nitride and treating the silicon nitride with a plasma that includes oxygen and an inert gas such as helium. The oxygen plasma flow rate comprises about 300 sccm to about 2000 sccm oxygen and about 400 to about 1000 sccm helium. The power for generating the plasma is obtained from an energy source such as an RF coil, illustrated schematically in one embodiment at 40 in FIG. 4 or a microwave source, illustrated schematically in one embodiment at 30 in FIG. 3.

While a radio frequency, RF, discharge field is described, it is believed that other oxygen plasma generating methods may be employed in the method of the present invention. For instance, the plasma source may include, in other embodiments, microwave discharges, electron cyclotron resonance sources, high density reflected electron, helicon wave, inductively coupled plasma and transformer coupled plasma. Microwave excitation may be applied by processes such as localized electron cyclotron resonance, surface wave and distributed electron cyclotron resonance.

Irrespective of the energy source, the energy used to generate the plasma has a power of about 150 to 900 watts. The pressure at which the substrate is exposed to the plasma is about 3.0 to 6.5 Torr. Once the substrate is treated with oxygen plasma, the substrate is overlayed with the photoresist.

Figure 3:
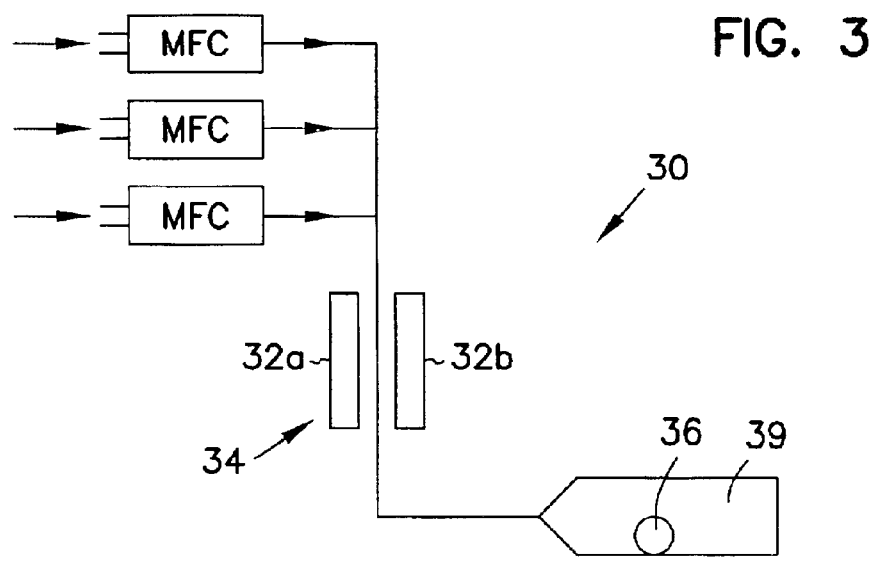
FIG. 3 is a schematic view of one embodiment of a process of the present invention for treating a semiconductor substrate with an oxygen plasma.
Figure 4:
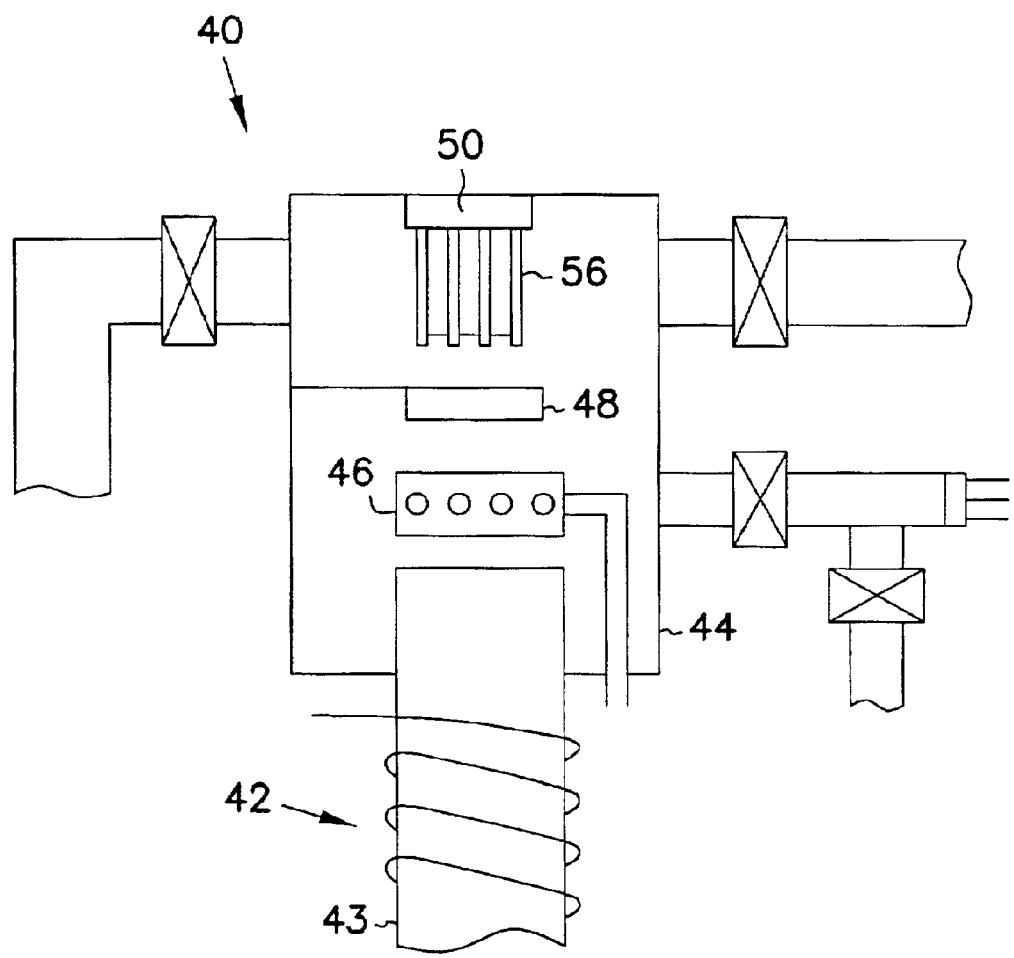
FIG. 4 is a schematic view of one other embodiment of a process of the present invention for treating a semiconductor substrate with an oxygen plasma

In one embodiment, the oxygen plasma is generated by exposing oxygen gas to electrodes 32a and 32b in the microwave process 30 in FIG. 3 or to an RF coil 42 in FIG. 4. The electrodes 32a and 32b are disposed at a distance of about 400 to 600 mils from each other. The silicon nitride substrate is exposed to the oxygen plasma for a time ranging from about 10 seconds to 5 minutes. The silicon nitride substrate is on wafer 36 in FIG. 3 and sample 48 in FIG. 4.

That the method of the present invention is effective in treating a silicon nitride substrate to reduce footing or undercutting of a photoresist is surprising because the high energy used to generate the plasma and high oxygen flow rate would be expected to produce ion-induced damage to the silicon nitride substrate due to ion acceleration into the substrate. This damage would be expected to profoundly effect symmetry of tiny microcircuits produced by photolithography.

However, contrary to expectations, the method of the present invention produces a substrate surface that is substantially uniformly compatible with a photoresist mask making the smallest microcircuit components known. The method is believed to "temper" the substrate so that it is substantially free of bonding discontinuities or viscosity discontinuities that adversely affect photoresist-substrate bonding. It is believed that the oxygen plasma treatment substantially uniformly hardens the silicon nitride surface, forming a substantially uniform crust on the surface.

Profile distortion which is reduced by the method of the present invention includes the formation of "footing" such as is shown at 10 and 16 in FIG. 1. The "footing" 10 is an absence of sharpness at a corner where one photoresist layer 12 meets another underlying layer 14. Profile distortions such as "footing," as well as other distortions such as "undercutting" and "skirting" occur because the photoresist liftoff is not uniform. For tiny components, profile distortion destroys the symmetry of the component. For larger components, profile distortions such as "footing" and "undercutting" impact are not so great because the distortions are small when compared to the size of the component part.

One embodiment of the method of oxygen plasma treatment of the present invention is used in conjunction with deep ultraviolet (DUV) lithography. DUV lithography utilizes ultraviolet, UV, light to expose and to "set" an acid catalyzed photoresist. Acid catalyzed photoresists have generally been used to fabricate microcircuits without significant problems. However, it has been found that as microcircuit size decreases, problems, such as formation of an undesirable "footing" on a positive resist, occur. The "footing" problem has been observed in the fabrication of larger circuits but has not created a damaging profile distortion because of the larger circuit size as compared to the size of the "footing."

The oxygen plasma is generated, in one embodiment, with an RF coil such as is illustrated at 42 in FIG. 4, in a remote process. Atomic oxygen is fed into a vessel 44 adjacent to the RF coil 42 at 46. The oxygen plasma is generated by electron impact dissociation of molecular oxygen in a plasma region. Once exposed to a semiconductor substrate 48, the atomic oxygen diffuses from the plasma region to the substrate surface. Oxygen ions generated in the plasma coil region are "thermalized" during transport to the substrate by a tantalum heater 50.

In another embodiment, the oxygen plasma is generated in a microwave cavity process as is generally shown at 30 in FIG. 3. With the use of microwaves, the process gas, oxygen and a helium diluent, are passed through a plasma generator 34 having a power of about 150 to 900 watts. The plasma generator includes two electrodes 32a and 32b that are positioned about 400 to 600 mils apart.

Figure 2:
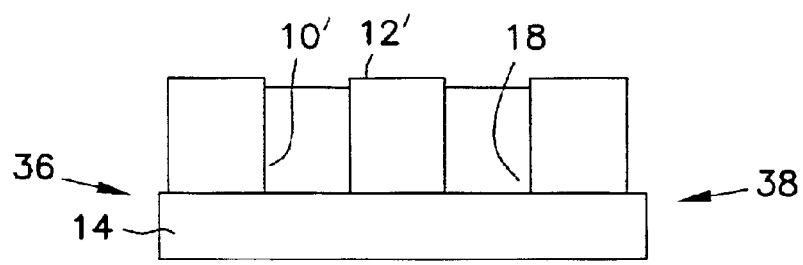
FIG. 2 is a cross-sectional view of a trench patterned in deep photo resist after treatment according to the method of the present invention.

The oxygen plasma is then transferred to a semiconductor device 36 with a silicon nitride surface 38, shown in FIG. 2. The semiconductor device 36 is in a chamber 39 that has been evacuated to a pressure of 3.0 to 6.5 Torr. Vacuum is maintained by a device such as a vacuum pump which is not shown.

An exposure of the oxygen plasma to the semiconductor substrate at the silicon nitride surface 38 occurs under conditions of pressure, concentration, and flow rate as described herein. The oxygen plasma treatment is administered to the substrate in order to neutralize the presence of any contaminants at the resist/substrate interface which are believed to interfere with sensitization of the photoresist material.

The method of the present invention treats a semiconductor substrate, such as a silicon-nitride substrate with oxygen plasma at a much greater vacuum, higher power, greater charge and greater concentration than heretofore contemplated. The consequence of utilizing the method of the present invention on a semiconductor substrate prior to subjecting the substrate to DUV lithography, especially with an acid catalyzed photoresist, is that any problems relating to profile distortion, such as "footing" or "undercutting" are reduced, if not substantially eliminated, for the smallest microcircuits contemplated.

One embodiment of the method of the present invention comprises treating a silicon-nitride film with an oxygen plasma in an environment that has a pressure of about 3.0 to 6.5 Torr. The oxygen plasma is formed as a discharge from an RF treatment. One configuration for RF treatment, shown at 40 in FIG. 4 includes an induction coil 42 wound around a tube 43, such as a quartz tube. The tube 43 is appended as required. The silicon-nitride film on the sample 48 and oxygen plasma are exposed to each other under conditions wherein the oxygen plasma is subjected to a power of about 150–900 watts within the chamber 44. The oxygen flow rate is about 300 to 2,000 sccm, wherein sccm refers to "standard condition cc/minutes". The exposure time ranges from about 10 seconds to 5 minutes.

A silicon-nitride film exposed to an oxygen plasma under conditions that are described herein is substantially resistant to problems relating to photoresist overlays, such as "footing" or "skirting" or "undercutting." What is believed to occur is that N—H bonds in the silicon-nitride film are neutralized in some fashion so that the N—H bonds are unable to deactivate an acid component at a chemically amplified resist/nitride film substrate interface. As a consequence, there is no discontinuity in tackiness over the silicon nitride surface that causes the resist to "stick" to the substrate preferentially at a particular area.

In one embodiment, the silicon-nitride film has been treated with the oxygen plasma and acid-catalyzed photoresist is applied to the film. One acid-catalyzed photoresist that may be employed in conjunction with the method of the present invention is identified as IBM2311 and is available from International Business Machines Corporation of Armonk, N.Y. While the IBM acid-catalyzed photoresist is described, it is believed that any acid-catalyzed photoresist is usable in the method of the present invention. The IBM acid-catalyzed photoresist is formed utilizing an acid-catalyzed deprotection reaction of tert-butoxycarbonyl oxystyrene (TBOC). The resist may be applied to the substrate by spin coating followed by a hot plate bake.

In general, resist compositions that are sensitive to ultraviolet, electron beam or x-ray radiation with positive or negative resist tone are suitable for use in embodiments of the present invention. Resists that have particular significance include resists that include a polymer having a recurrent acid labile pendant group with a cationic photo initiator such as aryldiazonium, diaryliodonium, or a triarylsulfonium metal halides. The polymer containing the initiator is coated as a thin film on the silicon-nitride substrate. This construction has been baked under controlled conditions and exposed to radiation in an image wise configuration and post baked under controlled conditions.

In the portions of the film on which radiation falls, the polymer recurrent acid labile pendant groups are cleaved to form polar recurring units and the exposed areas are selectively removed by treatment with an alkaline developer or polar solvent. Because the unexposed portions of the film are non-polar, they are selectively removed by treatment with a non-polar solvent. Thus, image reversal is extremely easily achieved by a proper choice of a developer owing to the great difference in the solubility characteristics of the exposed and unexposed portions. One suitable resist such as is described in U.S. Pat. No. 4,491,628 which is incorporated by reference herein, describes a resist which is susceptible to a chemical reaction which is dependent upon side exchange cleavage.

By treating the silicon-nitride film with the oxygen plasma prior to application of the photo resist, profile distortions such as "footing" and "undercutting" are reduced if not substantially eliminated. A cross-sectional view of a trench 10 patterned in a deep ultraviolet sensitive photoresist well is shown in FIG. 1. The structure includes 11,000 angstroms of an acid-catalyzed photoresist 12. Under the photoresist 12 is a 4,000 angstrom layer of silicon-nitride 14. A "footing" 16 is present at the bottom of the feature where the image side walls encroach on a clear area.

By exposing the silicon-nitride film to an oxygen plasma under the conditions described herein prior to resist application, the "footing" distortion 16 is substantially eliminated. It is believed that the method of the present invention is usable to prevent an "undercutting" distortion as well. A structure illustrated at 36 in FIG. 2 is processed identically to that of FIG. 1, except that the sample shown was subjected to an extended oxygen plasma step as described above. A trench 10' is formed in a photoresist 12' with vertical resist profiles and sharp corners 18. The improved profile shown in FIG. 2 is a result of the treatment of the silicon-nitride film 14 with the oxygen plasma prior to resist application.

While the invention has been particularly shown and described with reference to preferred embodiments hereof, it will be understood by those skilled in the art that there is changes in form and details may be made herein without departing from the spirit and scope of the invention.

What is claimed is:

1. A method for reducing profile distortion in semiconductor fabrication using deep ultraviolet lithography without roughening a semiconductor substrate surface, comprising:

providing a semiconductor substrate comprising a film comprising silicon-nitride;

exposing oxygen gas to an energy source that is microwave energy, generating about 150–900 watts in order to make oxygen plasma;

treating the film in a vacuum of about 3.0–6.5 Torr, for a time of about 10 seconds to about 5 minutes, and in an atmosphere free of argon comprising oxygen plasma as the gas present in the greatest concentration wherein the oxygen plasma flow rate is at least about 300 sccm oxygen and the atmosphere renders the substrate resistant to profile distortion and roughening to make a treated substrate;

applying a resist to the treated substrate;

patterning the resist; and treating the resist with UV light.

2. The method of claim 1 wherein the oxygen plasma is made by electromagnetic excitation of oxygen gas by electrodes that are about 400 to 600 mils apart.

3. The method of claim 1 wherein the reduced profile distortion is footing.

4. The method of claim 1 wherein the reduced profile distortion is undercutting.

5. The method of claim 1 and further including removing the resist from the silicon nitride film with reduced profile distortion.

6. The method of claim 1 wherein the oxygen flow rate is not greater than about 2000 sccm.

7. The method of claim 1 and further comprising adding an inert gas to the oxygen gas.

8. A method for making a microcircuit having a uniform symmetry, using deep ultraviolet lithography, without roughening a semiconductor substrate surface, comprising:

providing a semiconductor substrate comprising a film comprising silicon-nitride;

treating the film in a vacuum of about 3.0–6.5 Torr, for a time of about 10 seconds to about 5 minutes, and in an atmosphere consisting essentially of oxygen plasma as the gas present in the greatest concentration wherein the oxygen plasma flow rate is at least about 300 sccm oxygen to about 2000 seem and helium in a concentration of about 400 to 1000 sccm and the atmosphere renders the substrate resistant to profile distortion and roughening to make a treated substrate wherein the oxygen plasma is made by exposing oxygen gas to microwave energy;

applying a resist to the treated substrate;

treating the resist with UV light; and patterning the resist to form a microcircuit.

9. The method of claim 8 and further including exposing oxygen gas to an energy source generating about 150–900 watts in order to make the oxygen plasma.

10. The method of claim 8 wherein the oxygen plasma is made by electromagnetic excitation of oxygen gas by electrodes that are about 400 to 600 mils apart.

11. The method of claim 8 wherein the reduced profile distortion is footing.

12. The method of claim 8 wherein the reduced profile distortion is undercutting.

13. The method of claim 8 and further including removing the resist from the silicon nitride film with reduced profile distortion.

14. A method for reducing losses in wafer manufacturing by reducing profile distortion in substrate fabrication without roughening, when using deep ultraviolet lithography, a semiconductor substrate surface, comprising:

providing a semiconductor substrate comprising a film comprising silicon-nitride;

treating the film in a vacuum of about 3.0–6.5 Torr, for a time of about 10 seconds to about 5 minutes, and in an atmosphere consisting essentially of oxygen plasma as the gas present in the greatest concentration wherein the oxygen plasma flow rate is at least about 300 sccm oxygen to about 2000 sccm wherein the oxygen plasma is made by an exposure to oxygen gas to an energy source that is microwave energy, and helium in a concentration of about 400 to 1000 sccm and the atmosphere renders the substrate resistant to profile distortion and roughening to make a treated substrate;

applying a resist to the treated substrate;

patterning the resist; and treating the resist with UV light.

15. The method of claim 14 and further including exposing oxygen gas to an energy source generating about 150–900 watts in order to make the oxygen plasma.

16. The method of claim 14 wherein the oxygen plasma is made by electromagnetic excitation of oxygen gas by electrodes that are about 400 to 600 mils apart.

17. The method of claim 14 wherein the reduced profile distortion is footing.

18. The method of claim 14 wherein the reduced profile distortion is undercutting.

19. The method of claim 14 and further including removing the resist from the silicon nitride film with reduced profile distortion.

20. A method for reducing profile distortion in semiconductor fabrication using deep ultraviolet lithography without roughening a semiconductor substrate surface, comprising:

providing a semiconductor substrate comprising a film comprising silicon-nitride;

exposing oxygen to an energy source that is RF energy, generating about 150–900 watts in order to make oxygen plasma;

treating the film in a vacuum of about 3.0–6.5 Torr, for a time of about 10 seconds to about 5 minutes, and in atmosphere free of argon comprising oxygen plasma as the gas present in the greatest concentration wherein the oxygen plasma flow rate is at least about 300 sccm oxygen and the atmosphere renders the substrate resistant to profile distortion and roughening to make a treated substrate;

applying a resist to the treated substrate;

patterning the resist; and treating the resist with UV light.

* * * * *

UNITED STATES PATENT AND TRADEMARK OFFICE
CERTIFICATE OF CORRECTION

PATENT NO. : 6,900,138 B1
DATED : May 31, 2005
INVENTOR(S) : Yin et al.

It is certified that error appears in the above-identified patent and that said Letters Patent is hereby corrected as shown below:

Title page,
Item [56], References Cited, U.S. PATENT DOCUMENTS, after "723" insert -- MP --.

Column 7,
Line 47, delete "seem" and insert -- sccm --, therefor.

Column 8,
Line 48, after "oxygen" insert -- gas --.
Line 53, insert -- an -- before "atmosphere".

Signed and Sealed this

Sixth Day of September, 2005

JON W. DUDAS
*Director of the United States Patent and Trademark Office*